United States Patent [19]

Morita et al.

[11] Patent Number: 5,861,102
[45] Date of Patent: Jan. 19, 1999

[54] METHOD FOR THE FLATTENING TREATMENT OF SILICON SINGLE CRYSTAL SURFACE

[75] Inventors: Yukinori Morita; Hiroshi Tokumoto, both of Ibaraki-ken, Japan

[73] Assignee: Japan as represented by Director General of Agency of Industrial Science and Technology, Japan

[21] Appl. No.: 614,478

[22] Filed: Mar. 13, 1996

[30] Foreign Application Priority Data

Mar. 15, 1995 [JP] Japan .................................. 7-082044

[51] Int. Cl.$^6$ .................................................. H01L 21/00
[52] U.S. Cl. .............................. 216/2; 438/694; 438/697
[58] Field of Search ................................ 156/616, 625.1; 257/295; 365/145; 216/2, 99; 437/238; 438/939, 694, 697

[56] References Cited

U.S. PATENT DOCUMENTS 4,430,150  2/1984  Levine et al. ........................... 156/616
5,609,682  3/1997  Sato et al. .................................. 117/2

Primary Examiner—John Goodrow
Attorney, Agent, or Firm—Wenderoth, Lind & Ponack, L.L.P.

[57] ABSTRACT

A semiconductor silicon single crystal wafer having a flat surface plane in a crystallographic orientation slightly deviated from the (001) axis was subjected to an oxidation treatment to form an oxidized surface film to such an extent that ordered stepwise level differences are formed in the interface between the oxidized surface film and the silicon surface followed by removal of the oxidized surface film with a hydrofluoric acid solution containing hydrogen chloride and having a pH not higher than 1 in such a fashion that the oxidized surface film is dissolved away by dipping the wafer in the acid solution while keeping equivalency relative to each of the stepwise level differences so that the wafer surface can be concurrently cleaned and flattened in an atomic level as evidenced by the scanning tunneling microscopic photographs.

4 Claims, 5 Drawing Sheets

METHOD FOR THE FLATTENING TREATMENT OF SILICON SINGLE CRYSTAL SURFACE

BACKGROUND OF THE INVENTION

The present invention relates to a method for the flattening and cleaning treatment of the surface of a single crystal of semiconductor silicon, which is widely used as a substrate of various kinds of electronic devices. In particular, the invention relates to a method for the treatment of removal of the surface contamination and the atomic scale corrugation at the same time, which is formed by the removal of the oxidized surface film on single crystal silicon surface oriented toward (001) crystallographic direction.

In recent semiconductor industry, almost all the electronic devices currently under use in various kinds of electronic instruments are formed on the substrate of a single crystal of semiconductor silicon. Among these electronic devices, central processing units or integrated circuits such as so-called microchips and memory devices are produced by forming an extremely fine network of electronic circuit on the (001) surface of a silicon single crystal wafer. Along with the trend in recent years toward finer and finer patterning of the electronic circuits, the requirements for the flatness and cleanness of the silicon wafer surfaces are increasing year by year.

For example, in the case of a 4-megabyte DRAM, which is a widely used memory device in present days, the smallest line-width of the circuit pattern to be formed on the (001) surface of a silicon single crystal wafer is about 0.5 $\mu$m. However the required fineness to form more integrated circuit is expected to decrease down to about 0.25 $\mu$m early in the coming new century. In order to accomplish such extreme fineness of the circuit network, the flatness of the (001) surface of a silicon wafer is further improved and any trace of contamination is avoided.

As a general method for cleaning of the surface of a silicon wafer, first the surface of the silicon wafer is oxidized to form an oxidized surface film, which is then removed by dissolving away with a hydrofluoric acid solution, and at the same time the surface free bonds of the outermost silicon atoms to be exposed by the oxide removal are terminated by the hydrogen atoms. The surface of a silicon wafer as formed is inherently covered by an oxidized surface film and, when the oxidized surface film is removed, the bare silicon surface is highly active so that the bare surface is immediately oxidized by the oxygen in the atmospheric air and contaminant materials from atmospheric air adsorb to the surface resulting in an oxidized and contaminated surface.

This problem can be solved at least partly by undertaking the method as mentioned above. Dissolving the oxidized surface film by the hydrofluoric acid and at the same time terminating the surface silicon bonds by the hydrogen atoms, the silicon surface becomes resistive against oxidation and the adsorption of the contaminants even in atmospheric condition because of the extremely strong bonding between the silicon and the hydrogen atoms.

However there are two problems about the conventional treatment method by using a hydrofluoric acid solution. First, the (001) surface of the silicon is subject to etching by the hydroxyl ions contained in the hydrofluoric acid solution. Second, the (001) surface is oxidized by the oxygen dissolved and contained in the hydrofluoric acid solution during the oxide removal process and the oxidized parts by the dissolved oxygen are to be removed by the hydrofluoric acid again. Hence the flatness of the resulting (001) surface decreases because of the surface etching with the process described above. Furthermore, in the cleaning and hydrogen termination treatment for the (001) surface by using hydrofluoric acid solution, it is unable to avoid that a surface strain is produced due to the repulsive force between the hydrogen atoms in the dihydride molecules formed on the surface or the intermolecular interaction between the precursor molecules formed on the surface during the removal process of the oxidized surface film. These strain contained in the silicon surface enlarge the surface energy but, in addition, the surface energy is effectively reduced by the relaxation due to the roughness of the (001) silicon surface. When the silicon surface is flattened by removing the roughness, strain is unevenly accumulated over the surface and the areas with accumulated strain enlarge the surface energy than the areas free from strain. Then, the area containing strain is easily attacked by the hydrofluoric acid, hydroxyl ions and molecular oxygen dissolved in the solution, and resulting surface flatness decreases.

Thus, the treatment method described above is only applicable to the flattening and cleaning of the only limited area of the (001) silicon surface, and there have existed no effective ways of the surface flattening and cleaning treatment over the whole (001) silicon surface.

SUMMARY OF THE INVENTION

Under such problems and disadvantages of the surface flattening and cleaning treatment by using hydrofluoric acid solution described above, the purpose of this invention is to provide a novel method for the surface flattening for the (001) oriented silicon and surface stabilization procedure against adsorption of the contaminant simultaneously by removing the oxidized surface film while suppressing the surface strain by using a unique treatment solution under specified treatment conditions.

Thus, the method of the present invention for the flattening and cleaning of the (001) surface of a single crystal silicon wafer comprises the steps of:

(a) oxidizing the (001) surface of a single crystal silicon wafer to form an oxidized surface film, so that regular stepwise level differences of a monatomic height of silicon are formed in the interface between the surface of the silicon wafer and the oxidized surface film; and (b) dipping the silicon wafer, which is covered by an oxidized surface film, into an aqueous hydrofluoric acid solution containing hydrogen chloride at a constant rate, while the removal of the oxidized surface film by dissolving with the hydrofluoric acid solution proceeds equivalently relative to the respective crystalline structures on the (001) surface of the silicon wafer.

In particular, it is preferable that the aqueous hydrofluoric acid solution containing hydrogen chloride mentioned above has a pH not higher than 1 and substantially free from oxygen dissolved therein.

DETAILED DESCRIPTION OF THE PREFERRED EMBODIMENTS

The inventors have conducted extensive investigations for a cleaning treatment of a (001) surface of a signal crystal silicon by first forming an oxidized surface film on the surface and then removing the oxidized surface film by dissolving away. And then, as a result, the inventors have arrived at a discovery that surface cleaning and atomic scale surface flattening can be accomplished under suppression of generation of the surface strain by first forming a uniform oxidized surface film on the (001) surface of the silicon and then immersing the surface into a hydrogen-terminating agent, which is incapable of dissolving the silicon surface and capable of selectively dissolving away the oxidized surface film, in a fashion that dissolution of the oxidized surface film proceeds in one and the same direction relative to the respective crystalline structures on the (001) silicon surface. Henceforth, on the base of this discovery, the inventors finally reached the completion of the present invention defined above.

Figure 1A:
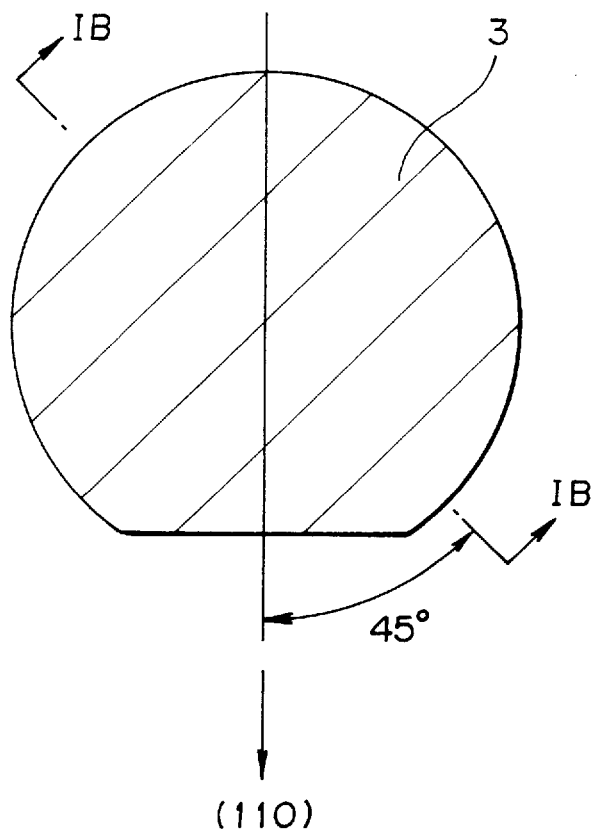
FIGS. 1A and 1B show a plan view and a vertical cross sectional view, respectively, schematically illustrating a single crystal wafer of silicon whose surface plane is slightly deviated from the (001) axis and covered by an oxidized surface film.
Figure 1B:
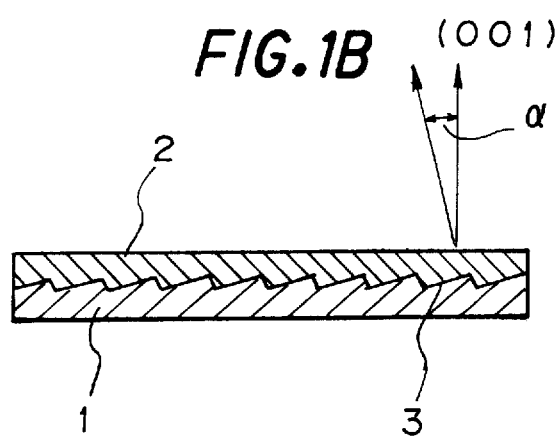

It is essential in the present invention to form ordered atomic steps on the (001) surface of silicon in order not to cause non-uniform accumulation of strain on the (001) surface of silicon after removal of or immediately before complete removal of the oxidized surface film. When ordered atomic steps are formed on the surface in this way, ordered relaxation of the surface strain takes place at the ends of the steps. Such a surface can be accomplished by the use of a silicon substrate of which the crystallographic orientation of the surface slightly deviates from the (001) plane. When a uniformly oxidized surface film is formed on the surface of such a silicon wafer by a conventional method such as the thermal oxidation method, namely, stepwise level differences in the height of a single atom appear periodically in the interface between the oxidized surface film and the silicon layer. FIG. 1A is a schematic plan view of the substrate surface which contains stepwise level differences at the interface between the oxidized surface film and the silicon layer. FIG. 1B is a cross sectional view thereof as cut and viewed along the direction shown by the arrows IB—IB in FIG. 1A showing a silicon wafer 1 per se, of which the crystallographic orientation of the surface deviates from (001) axis by an angle α and an oxidized surface film 2 formed thereon forming an interface 3 which is formed by the stepwise level differences showing a sawtooth-like feature in the cross section.

The steps which are mentioned above are formed as an atomic step of (001) silicon after removal of the oxidized surface layer. The stepped surfaces on the (001) surface of silicon have a structure in which each monatomic layer has a crystalline structure with rotation by an angle of 90° from adjacent ones. Accordingly, it is preferable in order to obtain an equivalent relationship relative to the surface strain at the ends of every atomic step that the substrate has an orientation inclined by about 45° from the direction of (110).

When the oxidized surface film is removed after formation of ordered stepwise level differences of a monatornic height of (001) silicon on the interface between the oxidized surface film and the surface of silicon on a wafer prepared in the way described above, the ordered atomic steps of (001) silicon appear on the surface and the surface strain can be relaxed in such a part.

It is essential that removal of the oxidized surface film is performed in such a way as to ensure equivalency of the removal of the oxidized surface film for all of the crystalline structures on the surface in order to prevent non-uniform distribution of the surface strain after removal of or immediately before complete removal of the oxidized surface film. The "equivalency" relative to the crystalline structures mentioned above means that removal of the oxidized surface film proceeds in a definite direction relative to the arrangement of atoms on the surface.

Figure 2:
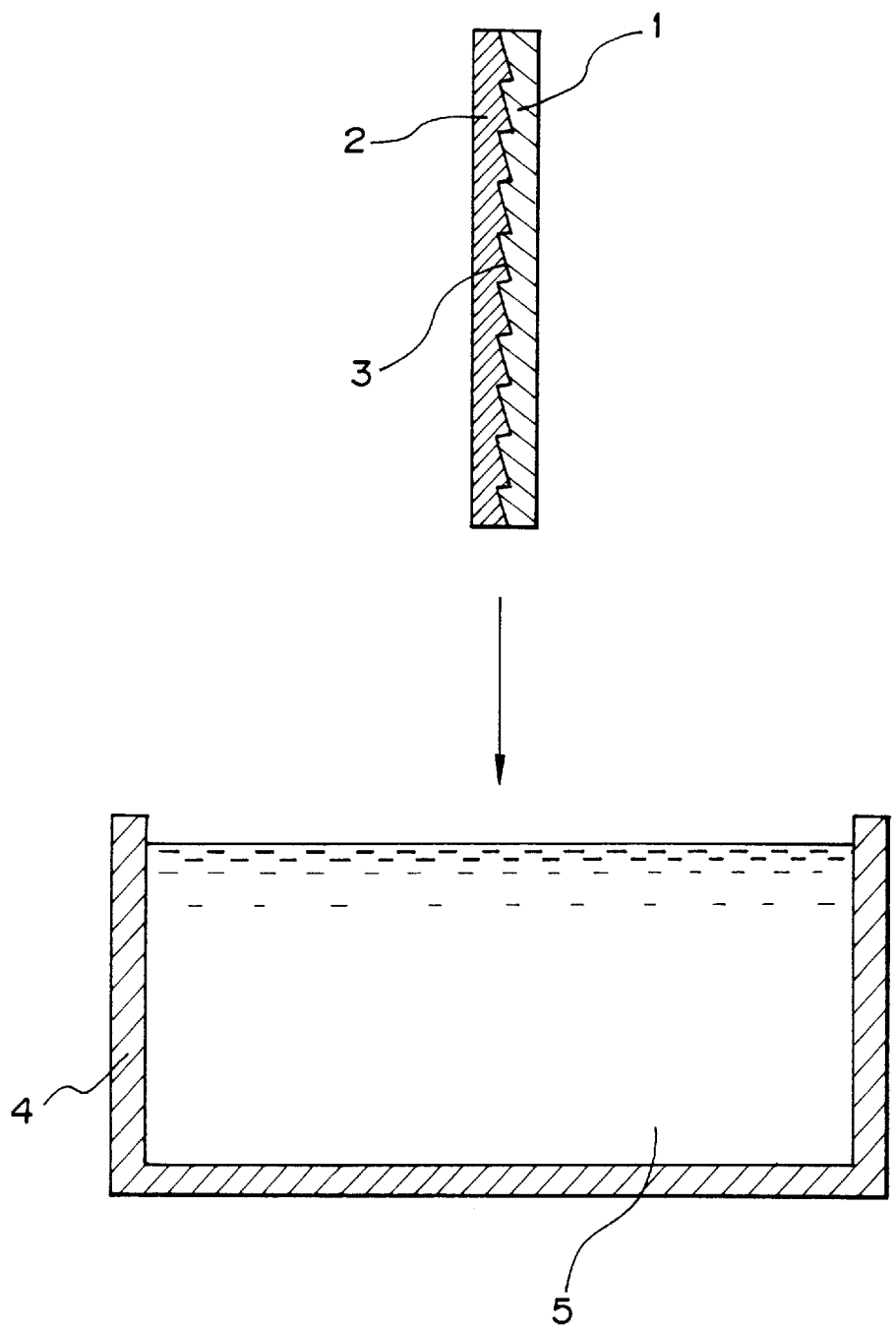
FIGS. 2 and 3 schematically show the procedure of the inventive surface treatment method. In these figures, the silicon wafer which is covered by oxidized surface film is being dipped into an aqueous hydrofluoric solution in a different direction relative to the crystallographic inclination of the surface.
Figure 3:
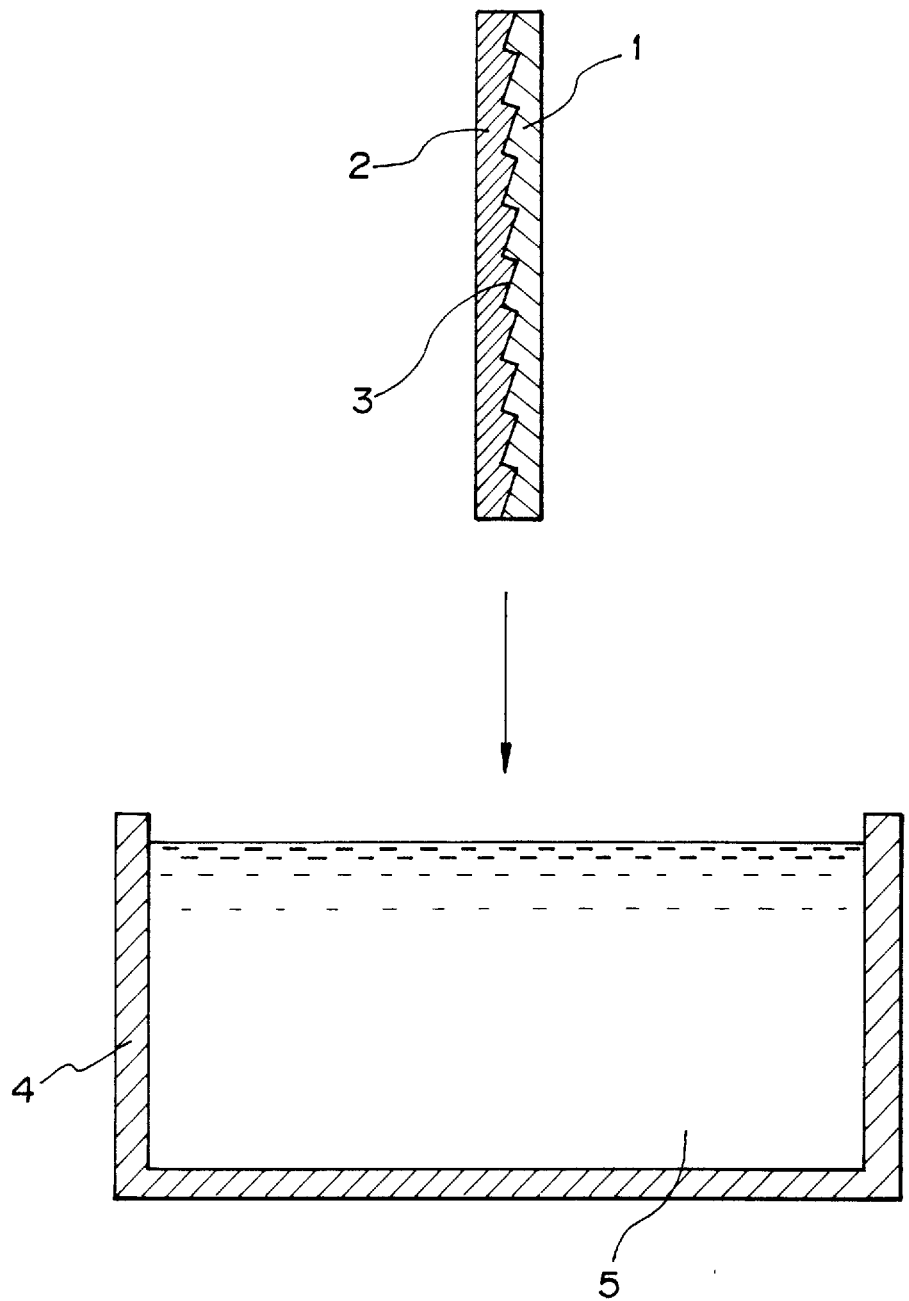

FIG. 2 is an illustration of the procedure for the removal of the oxidized surface film by dipping the wafer 1 in a constant rate into the treatment solution 5 in a vessel 4 while holding the wafer 1, which is covered by an oxidized surface film 2, in such a direction that the lower-height line of a terraced step 3 first reaches the liquid surface. In this way, residual surface strain in a non-uniform distribution can be suppressed and a decrease in the surface flatness due to the non-uniform distribution of the spots susceptible to erosion can be prevented. FIG. 3, on the other hand, is an illustration of the procedure for the removal of the oxidized surface film by dipping the wafer 1 in a constant rate into the treatment solution 5 in a vessel 4 while holding the wafer 1, which is covered by an oxidized surface film 2, in such a direction that the higher line of a terraced step 3 first reaches the liquid surface.

The treatment solution which is used for the removal of the oxidized surface film should contain hydrogen fluoride in order to terminate the free bonds of silicon atoms located in the outermost layer of silicon surface after removal of the oxidized surface film by the hydrogen atoms. Further, it is also essential that the concentration of hydroxyl ions, which cause erosion of the silicon surface, should be decreased in order to remove the oxidized surface film selectively under the equivalent removal conditions for all the crystallographic directions of the silicon and in order not to dissolve the silicon layer suppressing surface roughening.

Decrease in the hydroxyl ion concentration in the treatment solution can be accomplished by the admixture of the solution with a hydroxyl ion-reducing agent which can be a hydrogen halide other than hydrofluoric acid, such as hydrogen chloride, hydrogen bromide and hydrogen iodide or, preferably, hydrogen chloride, which can increase the concentration of hydrogen ions but has no effect to regenerate the oxidized surface film on the surface of silicon. Namely, a preferable treatment solution is an aqueous solution containing 1 to 25% by weight of hydrogen fluoride and 20 to 35% by weight of hydrogen chloride. The concentration of hydroxyl ions should be as low as possible or the concentration of hydrogen ions should be as high as possible. For example, the concentration of hydroxyl ions desirably should not exceed $10^{-13}$ mole/liter or the pH value of the solution should be 1 or lower. This concentration of hydroxyl ions is one tenth or lower of the concentration in conventional treatment solutions. It is also important that the treatment solution does not contain molecular oxygen dissolved therein because dissolved oxygen in the treatment solution is responsible for the regeneration of the oxidized surface film after or during removal thereof. Commercial products of hydrofluoric acid and hydrochloric acid free from dissolved oxygen are available on the market and can be used satisfactorily.

According to the procedure of the inventive method described above, the cleaning and flattening in an atomic scale can be accomplished on the (001) surface of a semiconductor silicon wafer merely, for the removal of the oxidized surface film under specified conditions, by using a readily available treatment solution necessitating no particular apparatus. Thus treated silicon wafer is quite satisfactory in the manufacture of silicon-based integrated circuits requiring extremely fine patterning.

Following is an example to illustrate the inventive method in more detail.

EXAMPLE.

A boron-doped p-type silicon wafer was used as the starting silicon wafer, of which the flat surface hat an approximate crystallographic orientation of (001) and the resistivity wag about 0.1 ohm-cm. The flat surface of the silicon wafer exactly had a crystallographic orientation deviated by 1° from the (001) plane. Treatment was undertaken such that stepwise level differences were formed at the interface between the oxidized surface film and the silicon layer in the direction inclined by 45° from the (110) direction.

The contamination with organic materials and heavy metals was removed from the substrate surface in a conventional way and then the substrate was heated at 1000° C. in a thermal oxidation furnace in an atmosphere of dry oxygen to form an oxidized surface film of about 110 nm thickness with uniformity and flatness.

A treatment solution was prepared by mixing an electronic-grade hydrofluoric acid containing 50% of hydrogen fluoride and electronic-grade hydrochloric acid containing 36% of hydrogen chloride in a volume ratio of 1:20. The concentrations of hydrogen fluoride and hydrogen chloride in the solution were about 3% and 35%, respectively, by weight and the concentration of hydroxyl ions therein was about $1 \times 10^{-13}$ mole/liter. No particular means was undertaken for the removal of dissolved oxygen since the reagents used in the preparation of the solution were each of the oxygen-free grade.

The procedure for the removal of the oxidized surface film was conducted in a way illustrated in FIG. 2 by gradually dipping the vertically held silicon wafer into the treatment solution at a constant rate of 1to 5 mm per second. The silicon wafer was held in such a vertical disposition that the stepwise level differences at the interface between the surface oxidized film and the silicon layer were dipped into the solution each from the higher line to the lower line of the terrace. After complete immersion, the silicon wafer was kept in the solution for 2 minutes and then pulled up therefrom followed by rinse and drying and the dried silicon wafer was introduced into a vacuum chamber for the examination with a scanning tunneling microscope (STM).

Figure 4:
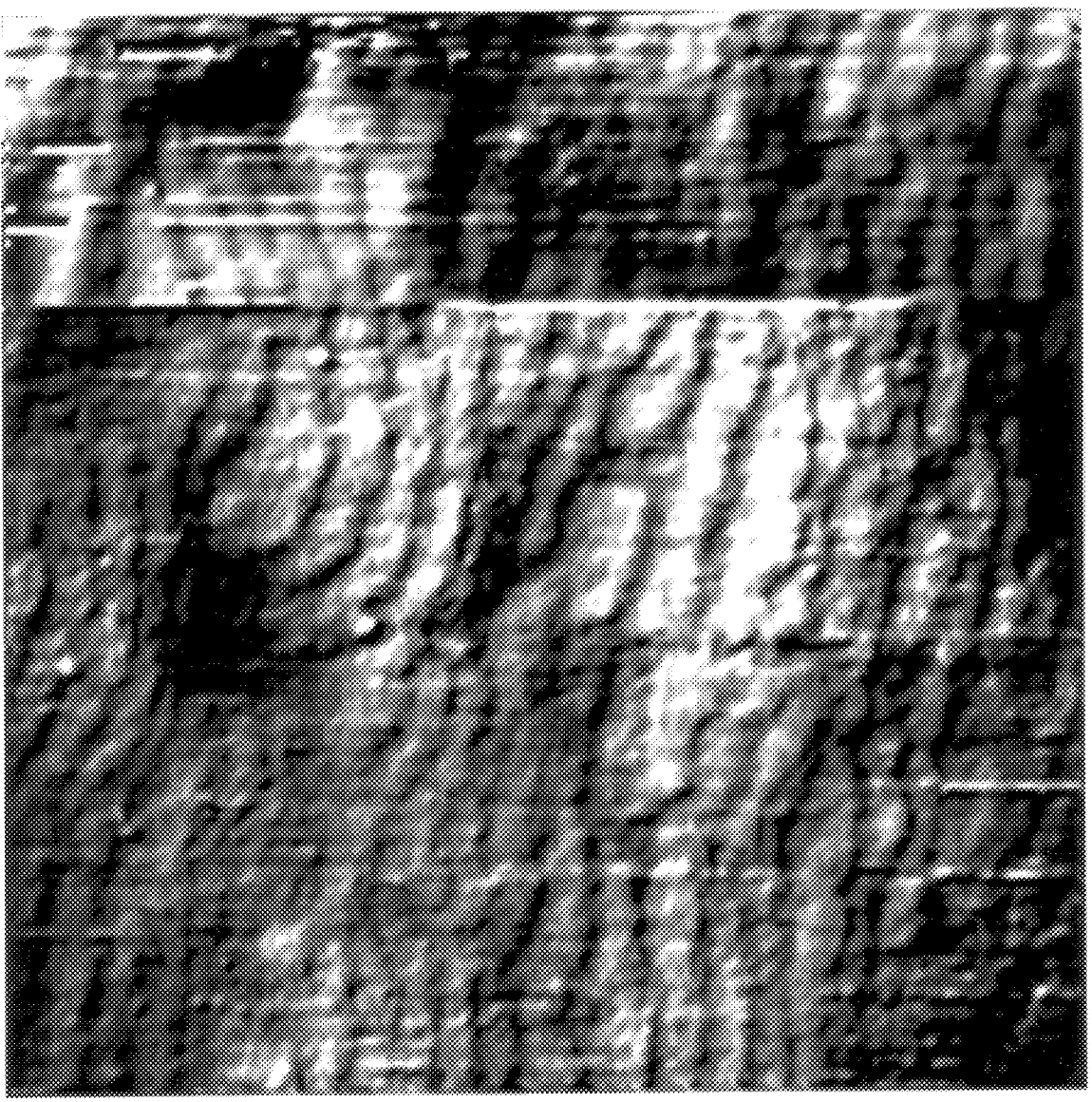
FIGS. 4 and 5 show a scanning tunneling microscopic photograph showing the crystalline structure on the (001) surface of a silicon single crystal wafer after treatment according to the inventive method for a 48 nm by 48 nm area and 4.8 nm by 4.8 nm area, respectively.
Figure 5:
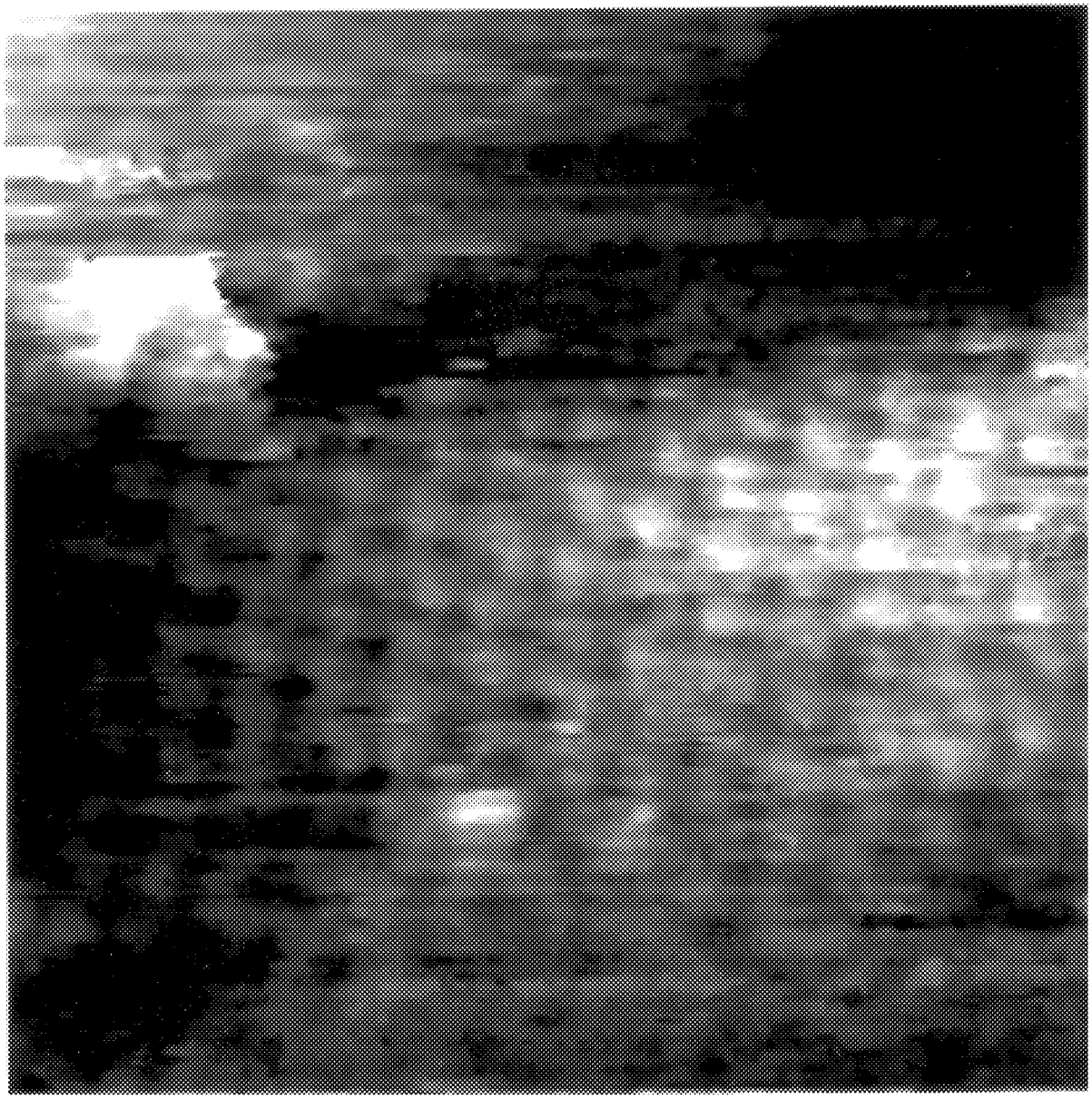

FIGS. 4 and 5 are each a STM photograph taken for the treated surface of the silicon wafer on an area of 48 nm by 48 nm square and 4.8 nm by 4.8 nm square, respectively. Measurement of the height difference between each terrace was made for the stepped structure observed in the STM photograph of FIG. 4 to give a value of about 0.14 nm in coincidence with the monatomic height of silicon on the (001) surface indicating that the stepped structure corresponded to atomic steps of silicon (001). No report is found in the literatures presenting such a clear image involving monatomic steps on the surface of silicon. Further, the photograph of FIG. 5 is suggestive of the termination of the free bonds of silicon atoms on the (001) surface of silicon with hydrogen atoms. These structures could be found over almost whole surface of the (001) surface indicating that the method of the present invention is effective for the termination of the (001) surface and flattening of the surface in an atomic scale.

What is claimed is:

1. A method for the concurrent flattening and cleaning of the (001) surface of a single crystal silicon wafer which comprises the steps of:

(a) oxidizing the (001) surface of a single crystal silicon wafer to form an oxidized surface film to such an extent that ordered stepwise level differences in a monatomic height of silicon are formed at the interface between the surface of the silicon wafer and the oxidized surface film; and (b) dipping the silicon wafer which is covered by the oxidized surface film into an aqueous hydrofluoric acid solution containing hydrogen chloride at such a constant rate that removal of the oxidized surface film by dissolving with the hydrofluoric acid solution proceeds equivalently in each of the respective crystalline structures on the (001) surface of the silicon wafer.

2. The method for the concurrent flattening and cleaning of the (001) surface of a single crystal silicon wafer as claimed in claim 1 in which the concentrations of hydrogen fluoride and hydrogen chloride in the aqueous hydrofluoric acid solution are in the ranges from 1 to 25% by weight and from 20 to 35% by weight, respectively.

3. The method for the concurrent flattening and cleaning of the (001) surface of a single crystal silicon wafer as claimed in claim 1 in which the aqueous hydrofluoric acid solution is substantially free from dissolved oxygen.

4. The method for the concurrent flattening and cleaning of the (001) surface of a single crystal silicon wafer as claimed in claim 1 in which the silicon wafer having an oxidized surface film is dipped into an aqueous hydrofluoric acid solution as being held in such a disposition that the stepwise level difference are kept in parallel to the liquid surface of the aqueous hydrofluoric acid solution.

* * * * *